(12) United States Patent
Lee et al.

(10) Patent No.: US 10,998,292 B2
(45) Date of Patent: May 4, 2021

(54) OFFSET PADS OVER TSV

(71) Applicant: Invensas Bonding Technologies, Inc., San Jose, CA (US)

(72) Inventors: Bongsub Lee, Santa Clara, CA (US); Guilian Gao, San Jose, CA (US)

(73) Assignee: Invensas Bonding Technologies, Inc., San Jose, CA (US)

( * ) Notice: Subject to any disclaimer, the term of this patent is extended or adjusted under 35 U.S.C. 154(b) by 0 days.

(21) Appl. No.: 16/440,633

(22) Filed: Jun. 13, 2019

(65) Prior Publication Data
US 2019/0385982 A1 Dec. 19, 2019

Related U.S. Application Data

(60) Provisional application No. 62/684,505, filed on Jun. 13, 2018.

(51) Int. Cl.
| H01L 21/44 | (2006.01) |
| H01L 23/04 | (2006.01) |
| H01L 25/065 | (2006.01) |
| H01L 23/00 | (2006.01) |
| H01L 23/48 | (2006.01) |
| H01L 23/482 | (2006.01) |

(Continued)

(52) U.S. Cl.
CPC .... H01L 25/0657 (2013.01); H01L 21/76843 (2013.01); H01L 21/76895 (2013.01); H01L 23/481 (2013.01); H01L 23/4824 (2013.01); H01L 23/5226 (2013.01); H01L 24/09 (2013.01); H01L 24/32 (2013.01); H01L 24/80 (2013.01); H01L 24/83 (2013.01); H01L 2224/08145 (2013.01); H01L 2224/80895 (2013.01); H01L 2224/80896 (2013.01); H01L 2225/06524 (2013.01); H01L 2225/06544 (2013.01)

(58) Field of Classification Search
CPC .................................................... H01L 23/481
USPC .................. 257/621, 698, 776; 438/280, 667
See application file for complete search history.

(56) References Cited

U.S. PATENT DOCUMENTS

| 5,753,536 A | 5/1998 | Sugiyama et al. |
| 5,771,555 A | 6/1998 | Eda et al. |

(Continued)

FOREIGN PATENT DOCUMENTS

| JP | 2013-33786 A | 2/2013 |
| JP | 2018-160519 A | 10/2018 |

(Continued)

OTHER PUBLICATIONS

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.

(Continued)

*Primary Examiner* — Calvin Lee

(57) ABSTRACT

Representative techniques and devices including process steps may be employed to mitigate the potential for delamination of bonded microelectronic substrates due to metal expansion at a bonding interface. For example, a metal pad may be disposed at a bonding surface of at least one of the microelectronic substrates, where the contact pad is positioned offset relative to a TSV in the substrate and electrically coupled to the TSV.

13 Claims, 9 Drawing Sheets

(51) Int. Cl.
*H01L 21/768* (2006.01)
*H01L 23/522* (2006.01)

(56) References Cited

U.S. PATENT DOCUMENTS

| | | | |
|---|---|---|---|
| 6,080,640 A | 6/2000 | Gardner et al. | |
| 6,423,640 B1 | 7/2002 | Lee et al. | |
| 6,465,892 B1 | 10/2002 | Suga | |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,385,283 B2 * | 6/2008 | Wu | H01L 21/6835 257/686 |
| 7,750,488 B2 | 7/2010 | Patti et al. | |
| 7,803,693 B2 | 9/2010 | Trezza | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 9,093,350 B2 | 7/2015 | Endo et al. | |
| 9,142,517 B2 | 9/2015 | Liu | |
| 9,171,756 B2 | 10/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,337,235 B2 | 5/2016 | Chen et al. | |
| 9,394,161 B2 | 7/2016 | Cheng et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,799,587 B2 | 10/2017 | Fujii et al. | |
| 9,893,004 B2 | 2/2018 | Yazdani | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,960,142 B2 | 5/2018 | Chen et al. | |
| 10,026,605 B2 | 7/2018 | Doub et al. | |
| 9,953,941 B2 | 8/2018 | Enquist | |
| 10,075,657 B2 | 9/2018 | Fahim et al. | |
| 10,103,122 B2 * | 10/2018 | Liu | H01L 24/27 |
| 10,269,756 B2 | 4/2019 | Uzoh | |
| 10,276,619 B2 | 4/2019 | Kao et al. | |
| 2004/0084414 A1 | 5/2004 | Sakai et al. | |
| 2006/0057945 A1 | 3/2006 | Hsu et al. | |
| 2007/0111386 A1 | 5/2007 | Kim et al. | |
| 2014/0065738 A1 | 3/2014 | Bhoovaraghan et al. | |
| 2014/0175614 A1 | 6/2014 | Wang et al. | |
| 2014/0175655 A1 | 6/2014 | Chen et al. | |
| 2015/0064498 A1 | 3/2015 | Tong | |
| 2016/0343682 A1 | 11/2016 | Kawasaki | |
| 2017/0179029 A1 | 6/2017 | Enquist et al. | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0219038 A1 | 8/2018 | Gambino et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0115277 A1 | 4/2019 | Yu et al. | |
| 2019/0131277 A1 | 5/2019 | Yang et al. | |
| 2019/0385935 A1 * | 12/2019 | Gao | H01L 24/83 |
| 2019/0385966 A1 * | 12/2019 | Gao | H01L 24/80 |

FOREIGN PATENT DOCUMENTS

| | | |
|---|---|---|
| KR | 1020100112852 A | 10/2010 |
| KR | 1020100112852 A | 9/2012 |
| WO | 2005-043584 A2 | 5/2005 |

OTHER PUBLICATIONS

Moriceau, H. et al., "Overview of Recent Direct Wafer Bonding Advances and Applications", Advances in Natural Sciences-Nanoscience and Nanotechnology, 2010, 12 pages.

Nakanishi, H. et al., "Studies on SiO2-SiO2 Bonding with Hydrofluoric Acid. Room Temperature and Low Stress Bonding Technique for MEMS," Tech. Research Lab., 200, Elsevier Science S.A., 8 pages.

Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(I), 6 pages.

Plobi et al., "Wafer Direct Bonding: Tailoring Adhesion Between Brittle Materials," Materials Science and Engineering Review Journal, 1999, 88 pages.

International Search Report and Written Opinion for PCT/US2019/037055, dated Oct. 11, 2019, 14 pages.

* cited by examiner

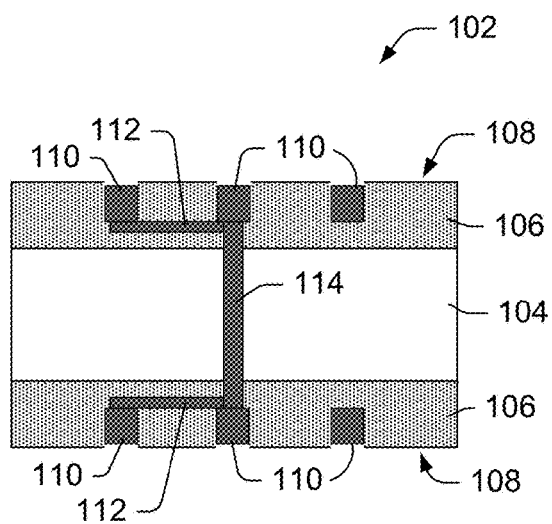
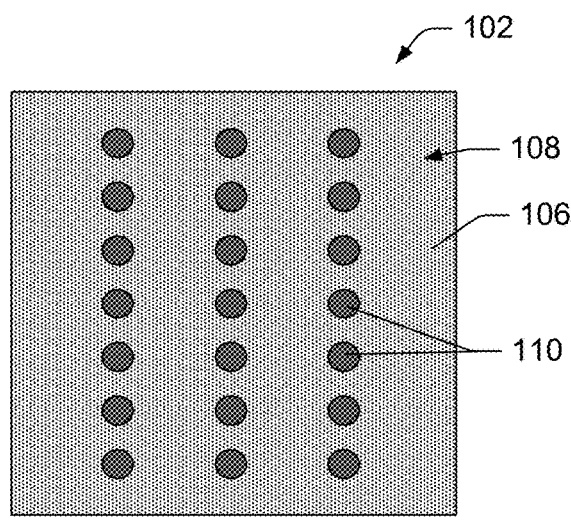
FIG. 1A  FIG. 1B
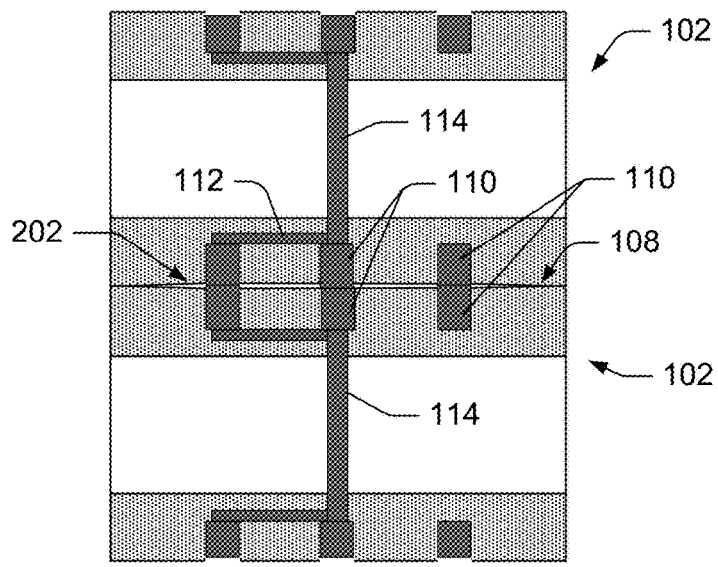
FIG. 2

2100

```
┌─────────────────────────────────────────────────────┐
│  EMBED A FIRST THROUGH SILICON VIA (TSV) INTO A FIRST SUBSTRATE │
│  HAVING A FIRST BONDING SURFACE, THE FIRST TSV EXTENDING        │
│  PARTIALLY THROUGH THE FIRST SUBSTRATE, NORMAL TO THE FIRST     │
│  BONDING SURFACE AND NOT EXPOSED AT THE FIRST BONDING           │
│                         SURFACE                                  │
│                          2102                                    │
└─────────────────────────────────────────────────────┘
                              │
                              ▼
┌─────────────────────────────────────────────────────┐
│   DISPOSE A FIRST METAL CONTACT PAD AT THE FIRST BONDING        │
│   SURFACE, OFFSET RELATIVE TO THE FIRST TSV, NOT OVERLAPPING    │
│   THE FIRST TSV, AND EXTENDING PARTIALLY INTO THE FIRST         │
│       SUBSTRATE BELOW THE FIRST BONDING SURFACE                 │
│                          2104                                    │
└─────────────────────────────────────────────────────┘
                              │
                              ▼
┌─────────────────────────────────────────────────────┐
│  ELECTRICALLY COUPLE THE FIRST METAL CONTACT PAD TO THE FIRST   │
│     TSV WITH ONE OR MORE EMBEDDED CONDUCTIVE TRACES             │
│                          2106                                    │
└─────────────────────────────────────────────────────┘
```

FIG. 21

OFFSET PADS OVER TSV

PRIORITY CLAIM AND CROSS-REFERENCE TO RELATED APPLICATION

This application claims the benefit under 35 U.S.C. § 119(e)(1) of U.S. Provisional Application No. 62/684,505, filed Jun. 13, 2018, which is hereby incorporated by reference in its entirety.

FIELD

The following description relates to integrated circuits ("ICs"). More particularly, the following description relates to manufacturing IC dies and wafers.

BACKGROUND

Microelectronic elements often comprise a thin slab of a semiconductor material, such as silicon or gallium arsenide, commonly called a semiconductor wafer. A wafer can be formed to include multiple integrated chips or dies on a surface of the wafer and/or partly embedded within the wafer. Dies that are separated from a wafer are commonly provided as individual, prepackaged units. In some package designs, the die is mounted to a substrate or a chip carrier, which is in turn mounted on a circuit panel, such as a printed circuit board (PCB). For example, many dies are provided in packages suitable for surface mounting.

Packaged semiconductor dies can also be provided in "stacked" arrangements, wherein one package is provided, for example, on a circuit board or other carrier, and another package is mounted on top of the first package. These arrangements can allow a number of different dies or devices to be mounted within a single footprint on a circuit board and can further facilitate high-speed operation by providing a short interconnection between the packages. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package).

Additionally, dies or wafers may be stacked in a three-dimensional arrangement as part of various microelectronic packaging schemes. This can include stacking a layer of one or more dies, devices, and/or wafers on a larger base die, device, wafer, substrate, or the like, stacking multiple dies or wafers in a vertical or horizontal arrangement, and various combinations of both.

Dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company. The bonding includes a spontaneous process that takes place at ambient conditions when two prepared surfaces are brought together (see for example, U.S. Pat. Nos. 6,864,585 and 7,485,968, which are incorporated herein in their entirety).

Respective mating surfaces of the bonded dies or wafers often include embedded conductive interconnect structures (which may be metal), or the like. In some examples, the bonding surfaces are arranged and aligned so that the conductive interconnect structures from the respective surfaces are joined during the bonding. The joined interconnect structures form continuous conductive interconnects (for signals, power, etc.) between the stacked dies or wafers.

There can be a variety of challenges to implementing stacked die and wafer arrangements. When bonding stacked dies using a direct bonding or hybrid bonding technique, it is usually desirable that the surfaces of the dies to be bonded be extremely flat, smooth, and clean. For instance, in general, the surfaces should have a very low variance in surface topology (i.e., nanometer scale variance), so that the surfaces can be closely mated to form a lasting bond.

Double-sided dies can be formed and prepared for stacking and bonding, where both sides of the dies will be bonded to other substrates or dies, such as with multiple die-to-die or die-to-wafer applications. Preparing both sides of the die includes finishing both surfaces to meet dielectric roughness specifications and metallic layer (e.g., copper, etc.) recess specifications. For instance, conductive interconnect structures at the bonding surfaces may be slightly recessed, just below the insulating material of the bonding surface. The amount of recess below the bonding surface may be determined by a dimensional tolerance, specification, or physical limitation of the device or application. The hybrid surface may be prepared for bonding with another die, wafer, or other substrate using a chemical mechanical polishing (CMP) process, or the like.

In general, when direct bonding surfaces containing a combination of a dielectric layer and one or more metal features (e.g., embedded conductive interconnect structures) are bonded together, the dielectric surfaces bond first at lower temperatures and the metal of the features expands afterwards, as the metal is heated during annealing. The expansion of the metal can cause the metal from both bonding surfaces to join into a unified conductive structure (metal-to-metal bond). While both the substrate and the metal are heated during annealing, the coefficient of thermal expansion (CTE) of the metal relative to the CTE of the substrate generally dictates that the metal expands much more than the substrate at a particular temperature (e.g., ~300 C). For instance, the CTE of copper is 16.7, while the CTE of fused silica is 0.55, and the CTE of silicon is 2.56.

In some cases, the greater expansion of the metal relative to the substrate can be problematic for direct bonding stacked dies or wafers. If a metal pad is positioned over a through-silicon via (TSV), the expansion of the TSV metal can contribute to the expansion of the pad metal. In some cases, the combined metal expansion can cause localized delamination of the bonding surfaces, as the expanding metal rises above the bonding surface. For instance, the expanded metal can separate the bonded dielectric surfaces of the stacked dies.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternatively, other implementations of devices and/or systems may include additional components, or various combinations of the described components, and remain within the scope of the disclosure.

FIG. 1A shows a cross-section of an example substrate with bonding pads and a TSV.

FIG. 1B shows a top view of the example substrate of FIG. 1A.

FIG. 2 shows a cross-section of two example bonded substrates with bonding pads and TSVs, and example resulting delamination.

FIG. 21 is a text flow diagram illustrating an example process of forming a microelectronic assembly to reduce or eliminate delamination of the bonded substrates, according to an embodiment.

SUMMARY

Figure 3:
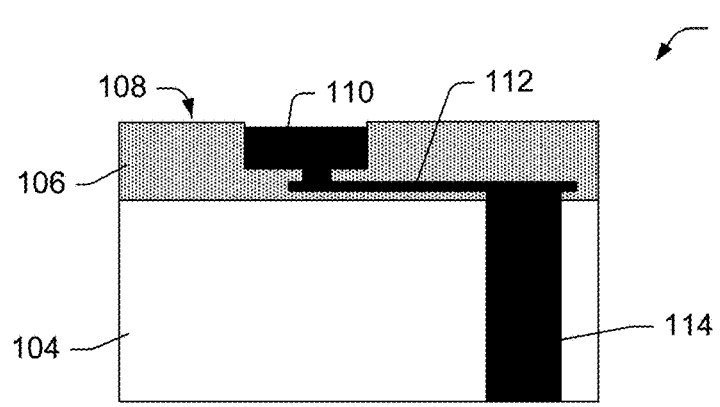
FIG. 3 shows a cross-section of an example substrate with a bonding pad positioned offset relative to the TSV, according to an embodiment.

Representative techniques and devices are disclosed, including process steps for preparing various microelectronic devices for bonding, such as for direct bonding without adhesive. In various embodiments, techniques may be employed to mitigate the potential for delamination due to metal expansion, particularly when a TSV or a bond pad over a TSV is presented at the bonding surface of one or both devices to be bonded. For example, in one embodiment, the TSV may extend partially through the substrate of the device, and a metal contact pad may be disposed at the bonding surface offset relative to the TSV. For instance, the contact pad is disposed so that it does not overlap the TSV. The contract pad may be electrically coupled to the TSV using one or more conductive traces, or the like.

In an embodiment where a contact pad is positioned offset relative to a TSV, the offset of the pad avoids the metal expansion of the TSV combining with the metal expansion of the pad, which can reduce or eliminate delamination that could occur otherwise.

In various implementations, an example process includes embedding a first through silicon via (TSV) into a first substrate having a first bonding surface, where the first TSV extends partially through the first substrate, normal to the first bonding surface and is not exposed at the first bonding surface. A first metal contact pad is disposed at the first bonding surface, offset relative to the first TSV, not overlapping the first TSV, and extending partially into the first substrate below the first bonding surface. The first metal contact pad is electrically coupled to the first TSV with one or more embedded conductive traces.

In various examples, the contact pad may be selected or formed based on a diameter or a surface area of the first metal contact pad, or a predicted recess for the first metal contact pad. For instance, in an embodiment, the process includes determining a desired recess for the first metal contact pad relative to the first bonding surface, to allow for expansion of the material of the first metal contact pad, based on an estimating, and selecting or forming the first metal contact pad to have a perimeter shape likely to result in the desired recess when the first metal contact pad is planarized. This may include forecasting an amount of recess that is likely to occur in a surface of the first metal contact pad as a result of the planarizing. In another embodiment, the process includes forming the desired recess in a surface of the first metal contact pad (prior to bonding), based on the prediction.

In various embodiments, the process includes reducing or eliminating delamination of bonded microelectronic components by selecting the first metal contact pad and offsetting the first contact pad relative to the TSV.

Additionally or alternatively, the back side of the first substrate may also be processed for bonding. One or more insulating layers of preselected materials may be deposited on the back side of the first substrate to facilitate proper reveal and planarization of the TSV and form the dielectric surface for bonding when the back side of the first substrate is to be direct bonded.

Further, the first TSV, as well as other TSVs within the first substrate may be used to direct or transfer heat within the first substrate and/or away from the first substrate. In some implementations, the thermal transfer TSVs may extend partially or fully through a thickness of the first substrate and may include a thermally conductive barrier layer. In such examples, barrier layers normally used around the TSVs that tend to be thermally insulating may be replaced with thermally conductive layers instead. In various implementations, some TSVs may be used for signal transfer and thermal transfer.

In an embodiment, a microelectronic assembly comprises a first substrate including a first bonding surface with a planarized topography having a first predetermined maximum surface variance. A first through silicon via (TSV) is embedded in the first substrate and extends partially through the first substrate. The first TSV extends normal to the first bonding surface and is not exposed at the first bonding surface.

A first metal contact pad is disposed at the first bonding surface and electrically coupled to the first TSV. The first metal contact pad is disposed offset relative to the first TSV, not overlapping the first TSV, and extends partially into the first substrate below the first bonding surface. One or more embedded conductive traces electrically couple the first TSV to the first metal contact pad.

Various implementations and arrangements are discussed with reference to electrical and electronics components and varied carriers. While specific components (i.e., dies, wafers, integrated circuit (IC) chip dies, substrates, etc.) are mentioned, this is not intended to be limiting, and is for ease of discussion and illustrative convenience. The techniques and devices discussed with reference to a wafer, die, substrate, or the like, are applicable to any type or number of electrical components, circuits (e.g., integrated circuits (IC), mixed circuits, ASICS, memory devices, processors, etc.), groups of components, packaged components, structures (e.g., wafers, panels, boards, PCBs, etc.), and the like, that may be coupled to interface with each other, with external circuits, systems, carriers, and the like. Each of these different components, circuits, groups, packages, structures, and the like, can be generically referred to as a "microelectronic component." For simplicity, unless otherwise specified, components being bonded to another component will be referred to herein as a "die."

This summary is not intended to give a full description. Implementations are explained in more detail below using a plurality of examples. Although various implementations and examples are discussed here and below, further implementations and examples may be possible by combining the features and elements of individual implementations and examples.

DETAILED DESCRIPTION

Overview

Referring to FIG. 1A (showing a cross-sectional profile view) and FIG. 1B (showing a top view), patterned metal and oxide layers are frequently provided on a die, wafer, or other substrate (hereinafter "die 102") as a hybrid bonding, or DBI®, surface layer. A representative device die 102 may be formed using various techniques, to include a base substrate 104 and one or more insulating or dielectric layers 106. The base substrate 104 may be comprised of silicon, germanium, glass, quartz, a dielectric surface, direct or indirect gap semiconductor materials or layers or another suitable material. The insulating layer 106 is deposited or formed over the substrate 104, and may be comprised of an inorganic dielectric material layer such as oxide, nitride, oxynitride, oxycarbide, carbides, carbonitrides, diamond, diamond like materials, glasses, ceramics, glass-ceramics, and the like.

A bonding surface 108 of the device wafer 102 can include conductive features such as contact pads 110, traces 112, and other interconnect structures, for example, embedded into the insulating layer 106 and arranged so that the conductive features 110 from respective bonding surfaces 108 of opposing devices can be mated and joined during bonding, if desired. The joined conductive features 110 can form continuous conductive interconnects (for signals, power, etc.) between stacked devices.

Damascene processes (or the like) may be used to form the embedded conductive features 110 in the insulating layer 106. The conductive features 110 may be comprised of metals (e.g., copper, etc.) or other conductive materials, or combinations of materials, and include structures, traces, pads, patterns, and so forth. In some examples, a barrier layer may be deposited in the cavities for the conductive features 110 prior to depositing the material of the conductive features 110, such that the barrier layer is disposed between the conductive features 110 and the insulating layer 106. The barrier layer may be comprised of tantalum, for example, or another conductive material, to prevent or reduce diffusion of the material of the conductive features 110 into the insulating layer 106. After the conductive features 110 are formed, the exposed surface of the device wafer 102, including the insulating layer 106 and the conductive features 110 can be planarized (e.g., via CMP) to form a flat bonding surface 108.

Forming the bonding surface 108 includes finishing the surface 108 to meet dielectric roughness specifications and metallic layer (e.g., copper, etc.) recess specifications, to prepare the surface 108 for direct bonding. In other words, the bonding surface 108 is formed to be as flat and smooth as possible, with very minimal surface topology variance. Various conventional processes, such as chemical mechanical polishing (CMP), dry or wet etching, and so forth, may be used to achieve the low surface roughness. These processes provides the flat, smooth surface 108 that results in a reliable bond.

In the case of double-sided dies 102, a patterned metal and insulating layer 106 with prepared bonding surfaces 108 may be provided on both sides of the die 102. The insulating layer 106 is typically highly planar (usually to nm-level roughness) with the metal layer (e.g., embedded conductive features 110) at or recessed just below the bonding surface 108. The amount of recess below the surface 108 of the insulating layer 106 is typically determined by a dimensional tolerance, specification, or physical limitation. The bonding surfaces 108 are often prepared for direct bonding with another die, wafer, or other substrate using a chemical-mechanical polishing (CMP) step and/or other preparation steps.

Some embedded conductive features or interconnect structures may comprise metal pads 110 or conductive traces 112 that extend partially into the dielectric substrate 106 below the prepared surface 108. For instance, some patterned metal (e.g., copper) features 110 or 112 may be about 0.5-2 microns thick. The metal of these features 110 or 112 may expand as the metal is heated during annealing. Other conductive interconnect structures may comprise metal (e.g., copper) through silicon vias (TSVs) 114 or the like, that extend normal to the bonding surface 108, partly or fully through the substrate 102 and include a larger quantity of metal. For instance, a TSV 114 may extend about 50 microns, depending on the thickness of the substrate 102. The metal of the TSV 114 may also expand when heated. Pads 110 and/or traces 112 may or may not be electrically coupled to TSVs 114, as shown in FIG. 1A.

Referring to FIG. 2, dies 102 may be direct bonded, for instance, without adhesive to other dies 102 with metal pads 110, traces 112, and/or TSVs 114. If a metal pad 110 is positioned over a TSV 114 (overlapping and physically and electrically coupled to the TSV 114), the expansion of the TSV 114 metal can contribute to the expansion of the pad 110 metal. In some cases, the combined metal expansion can cause localized delamination 202 of the bonding surfaces at the location of the TSV 114 (or TSV 114/pad 110 combination), as the expanding metal rises above the bonding surface 108. For instance, the expanded metal can separate the bonded dielectric surfaces 108 of the stacked dies 102.

Example Embodiments

Figure 4:
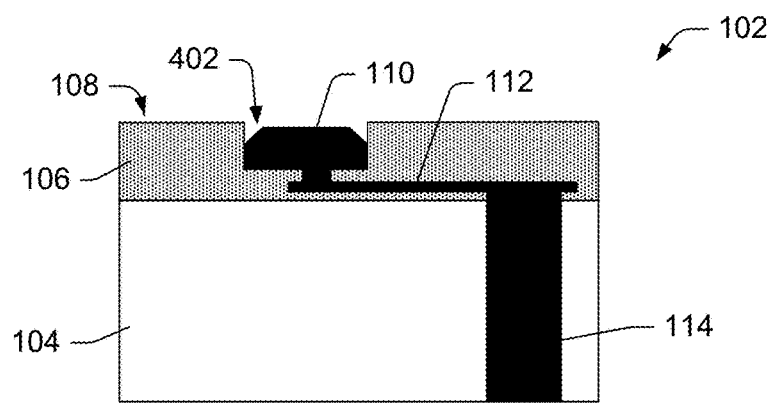
FIG. 4 shows a cross-section of an example substrate with a bonding pad positioned offset relative to the TSV, the bonding pad having an uneven surface, according to an embodiment.
Figure 5:
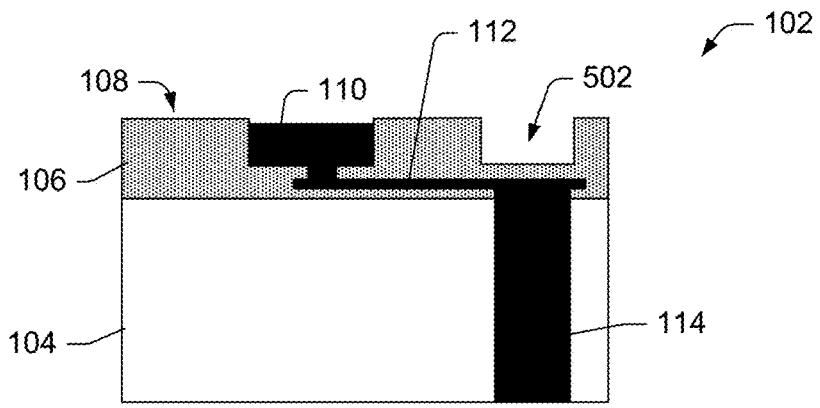
FIG. 5 shows a cross-section of an example substrate with a bonding pad positioned offset relative to the TSV and a recess disposed above the TSV, according to an embodiment.

Referring to FIGS. 3-5, in various embodiments, techniques may be employed to mitigate the potential for delamination due to metal expansion. For example, in one embodiment, a contact pad 110 may be disposed on the bonding surface 108, offset relative to the TSV 114 and not overlapping the TSV 114. The contact pad 110 may be embedded in the dielectric layer 106, extending partially into the dielectric layer 106 below the bonding surface 106, and electrically coupled to the TSV 114 using a trace 112, or the like. In some embodiments, the size of the metal pad 110 may be selected based on the material of the pad 110, its thickness, and anticipated recess during CMP processing.

In various implementations, disposing the contact pad 110 offset relative to the TSV 114 (e.g., the contact pad 110 is not disposed over the TSVs 114 or overlapping the TSV 114) reduces or eliminates delamination of bonded dies 102, when the dies 102 are heat annealed and the metal of the TSV 114 and the contact pad 110 expand. In the implementations, the TSV 114 will not (or is less likely to) contribute its expanding metal to the expanding metal of the offset pad 110. Accordingly, a predetermined recess in the pad 110 can be sufficient to provide room for the material expansion of the pad 110.

In an embodiment, the size of the contact pads 110 are selected or formed by estimating an amount that the material of the contact pad 110 will expand when heated to a preselected temperature (~300°), based on a volume of the material of the contact pad 110 and a coefficient of thermal expansion (CTE) of the material of the contact pad 110, and predicting an amount that the material of the contact pad 110 will expand when heated to the preselected temperature. The contact pad 110 is planarized along with the bonding surface 108 of the dielectric layer 106, including recessing the contact pad 110 to have a predetermined recess depth (or amount) relative to the bonding surface 108, based on estimating and predicting the expansion of the contact pad 110 material at the predetermined temperature.

In one embodiment, a contact pad 110 may be selectively etched (via acid etching, plasma oxidation, etc.) to provide the desired recess depth (to accommodate a predicted metal expansion). In another example, as shown at FIG. 4, a pad 110 or a corresponding TSV 114 may be selected, formed, or processed to have an uneven top surface as an expansion buffer. For example, referring to FIG. 4, the top surface of the pad 110 may be formed or selectively etched to be rounded, domed, convex, concave, irregular, or otherwise non-flat to allow additional space 402 for material expansion.

The additional space 402 may be determined and formed based on the prediction of the amount that the material of the contact pad 110 will expand when heated. In various implementations, the top surface of the contact pad 110 may be formed to be uneven during deposition, or may be etched, grinded, polished, or otherwise made uneven after forming the contact pad 110. In some cases, the top surface of the pad 110 may be made uneven during CMP of the bonding surface 108.

Additionally or alternately, the dielectric 106 around the metal pad 110 can be formed or shaped to allow room for the metal of the pad 110 to expand. In one example, a CMP process can be used to shape the surface 108 of the dielectric 106 around the metal pad 110, or in other examples other processes can be used, so that the dielectric 106 around the pad 110 includes a recess or other gap that provides room for metal expansion. In an embodiment, the dielectric 106 can be recessed (e.g., with CMP) while the bonding surface 108 is being prepared. In the embodiment, the metal pad 110 and the dielectric 106 may be recessed concurrently (but at different rates). For instance, the process may form erosion in the dielectric 106 around the edges of the metal pad 110 while recessing the metal pad 110.

In various embodiments, the pad 110 and/or the TSV 114 are comprised of copper, a copper alloy, or the like. In a further embodiment, the materials of the pad 110 and/or the TSV 114 may be varied to control metal expansion and potential resulting delamination. For instance, in some embodiments, the pad 110 and/or the TSV 114 may be comprised of different conductive materials, perhaps with lower CTEs. In some embodiments the TSV 114 may be comprised of a different conductive material (with a lower CTE) than the contact pad 110. For example, the TSV 114 may be comprised of tungsten, an alloy, or the like.

In other embodiments the volume of material of the TSV 114 may be varied to control metal expansion and the potential for resulting delamination. For instance, in some embodiments, a TSV 114 with a preselected material volume (e.g., less volume of material) may be used, when this is allowable within the design specifications. The preselection of volume of the TSV 114 may be based on predicted material expansion of the TSV 114.

Alternately, the top surface of the TSV 114 can be arranged to be exposed at the bonding surface 108 and used as a contact pad. This arrangement can avoid combining the expansion of the metal pad 110 with that of the TSV 114, and so minimize or eliminate delamination.

In another implementation, as shown at FIG. 5, a recess 502 is disposed in the bonding surface 108 and through a portion of the insulating layer 106 to provide stress relief for material expansion of the TSV 114 in the z-direction. For instance, the recess 502 can be formed by etching the dialectic layer 106. In the implementation, at least a portion of the recess 502 is disposed over (e.g., overlapping) the TSV 114. The recess 502 can be tuned, for example, to the volume of the TSV 114, using a prediction of the expansion of the TSV 114, based on the volume of the particular metal of the TSV 114. In some cases, the diameter or area of the recess 502 is larger than the diameter or cross-sectional area of the TSV 114.

The recess 502 may or may not expose the TSV 114. The recess 502 may have a depth that extends to the top of the TSV 114 or the trace 112 (for instance if it was desired to make contact with the TSV 114 or the trace 112), but generally the depth of the recess 502 is more shallow and the TSV 114 and/or the trace 112 remain covered by a portion of the insulating layer 106. The recess 502 may be left open or may be filled with a material, such as a compliant material.

After preparation of the bonding surface 108 (e.g., by CMP) the die 102 may be direct bonded, for instance, without adhesive to other dies 102 with metal pads 110, traces 112, and/or TSVs 114. The material of the TSV 114 and the material of the pad 110 expand during heated annealing as the mating contact pads 110 of opposite dies 102 bond to form a single conductive interconnect. However, the metal expansion does not cause delamination of the bonding surfaces since the expanding metal of the TSV 114 does not combine with the expanding metal of the contact pads 110 (because the contact pads 110 are offset from the TSVs 114).

Further, if the contact pads 110 are sufficiently recessed, the expanding metal of the contact pads 110 does not separate the bonded dielectric surfaces 108 of the stacked dies 102 (see FIGS. 15-19). When using surface preparation processes such as CMP to prepare the bonding surface 108 of the die 102, the metal pads 110 on the bonding surface 108 can become recessed (intentionally or unintentionally) relative to the dielectric 106, due to the softness of the contact pads 110 (which may comprise copper, for instance) relative to the dielectric 106 (which may comprise an oxide, for example).

In various embodiments, the amount of recessing of a metal pad 110 may be predictable, based on the surface preparation technique used (e.g., the chemical combination used, the speed of the polishing equipment, etc.), the materials of the dielectric layer 106 and the metal pads 110, the spacing or density of the metal pads 110, and the size (e.g., area or diameter) of the metal pads 110. In the embodiments, the area or diameter of the metal pads 110 may be selected (e.g., for a particular metal thickness) to avoid delamination of bonded dies 102 based on the recess prediction and the expected metal expansion of the metal pad 110.

In the embodiments, the shape and size of a contact pad 110 positioned offset from a TSV 114 may be tailored or selected to avoid delamination based on the recess prediction and the expected metal expansion of the metal pad 110.

Additional Embodiments

FIGS. 6-14 illustrate examples of backside die 102 processing, according to various embodiments. In some implementations, where dies 102 are stacked and direct bonded without adhesive, the backside 602 of the die 102 may receive different preparation than the topside bonding surface 108, when the backside 602 is prepared for direct bonding. Instead of forming the dielectric layer 106 on the backside 602 of the die 102, the backside 602 may be prepared differently to reduce process steps, reduce manufacturing costs, or for other reasons.

In one implementation, the backside 602 is prepared so that the TSV 114 is exposed, to be used as a contact surface for bonding to a conductive pad, interconnect, or other conductive bonding surface. The preparation may include depositing one or more layers of insulating material and planarizing (via CMP, for example) the insulating material to reveal the TSV 114. In some cases, however, the expansion of the material of the TSV 114 during heated annealing can cause the insulating material and/or the substrate 104 to become damaged.

In an embodiment, as shown in FIGS. 6-14, one or more layers of inorganic dielectric materials with different residue stress characteristics may be deposited on the backside 602 to balance stress on the device side of the die 102 and minimize die warpage after singulation. The layers of insulating material can be planarized and otherwise prepared as a bonding surface on the backside 602 of the die 102.

Figure 6:
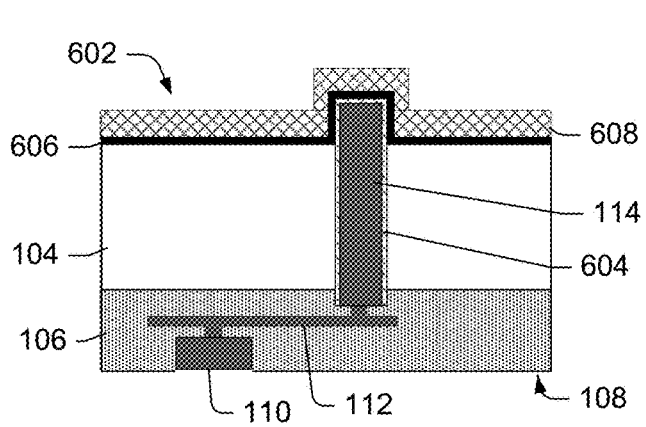
FIGS. 6-14 show a cross-section of an example substrate with a bonding pad positioned offset relative to a TSV, illustrating an example backside process of the substrate, according to an embodiment.

As shown at FIG. 6, the TSV 114 is disposed within the die 102, transverse to the bonding surface 108 of the die 102. A dielectric liner and diffusion barrier 604 surrounds the TSV 114 to prevent diffusion of the metal of the TSV 114 (e.g., copper) into the material of the base substrate 104 (e.g., silicon). The base substrate 104 is thinned and selectively etched to expose the bottom end of the TSV 114 with the liner and diffusion barrier layer 604 intact. In an embodiment, as shown at FIG. 6, another diffusion barrier 606 is deposited on the surface of the backside 602 of the die 102. In an example, the diffusion barrier 606 comprises a dielectric, such as a nitride or the like.

Figure 7:
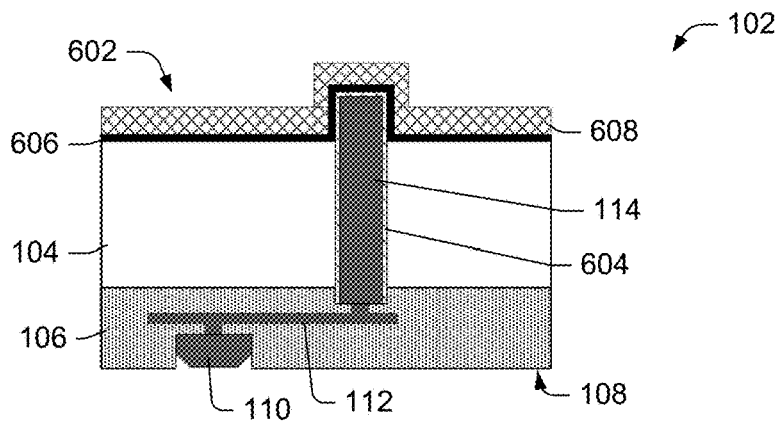

In various embodiments, one or more dielectric layers, which may have different residue stress characteristics are then deposited onto the backside 602 of the die 102 to prevent damage to the die 102 when the material of the TSV 114 expands. For example, a first layer 608, comprising a first low temperature dielectric, such as an oxide, may be deposited over the backside 602, including over the diffusion layer 606. FIG. 7 shows this scenario with a formed contact pad 110 on the front side bonding surface 108.

Figure 8:
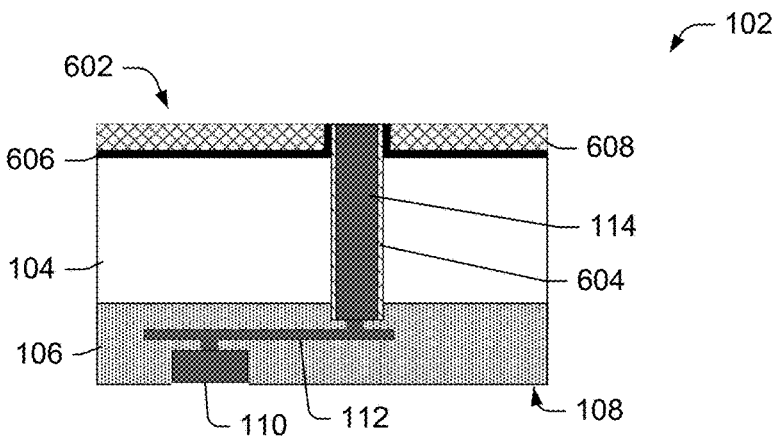

As shown at FIG. 8, the backside 602 is planarized (via CMP, for example), including the one or more dielectric layers 608 to form a flat, smooth bonding surface for direct bonding. The remaining dielectric layer 608 can assist with warpage control, based on a residue stress characteristic of the dielectric layer 608.

Figure 9:
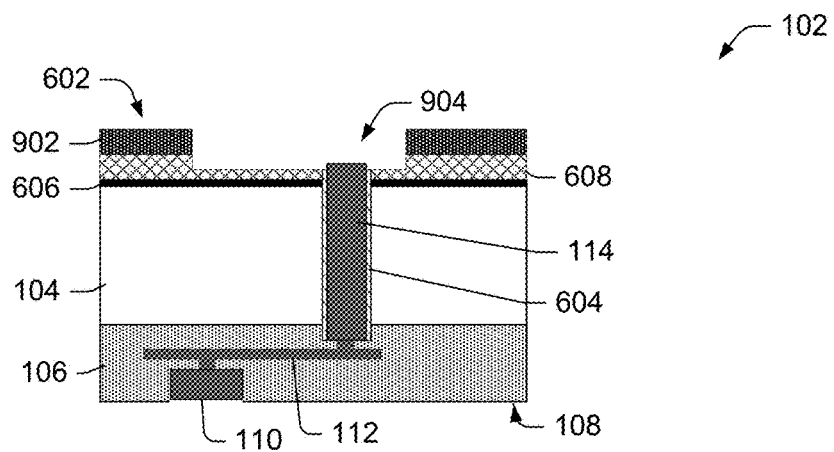
Figure 10:
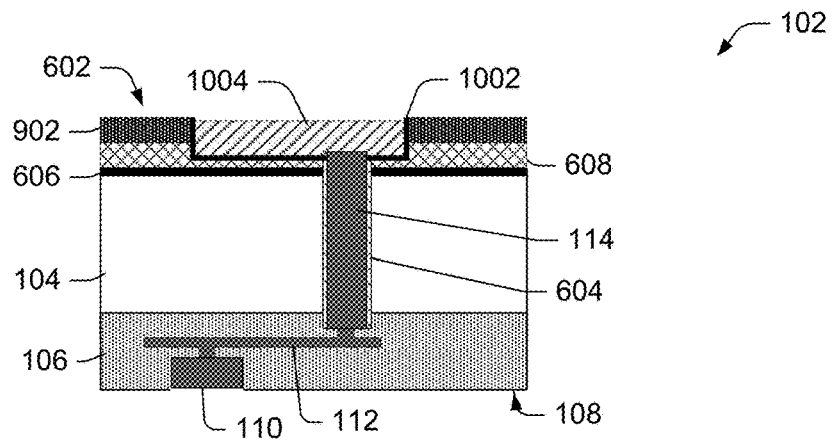

In an embodiment, as shown at FIGS. 9-10, a contact pad 1004 (or other conductive structure) may be coupled to the TSV 114 on the backside 602 of the die 102. As shown at FIG. 9, after deposition of the first low temperature oxide stress layer 608 (which also comprises the bonding layer in some implementations), a second dielectric layer 902 (which may comprise a low temperature oxide) may be deposited over the first layer 608. No barrier or adhesion layer is needed between the two oxide layers (608 and 902). In various implementations, the first layer 608 and the second layer 902 are comprised of similar or the same materials (in varying thicknesses). In other implementations, the first layer 608 and the second layer 902 are comprised of different materials. In alternate implementations, additional dielectric layers may also be deposited over the first 608 and second 902 layers.

The backside 602 is patterned and opened (e.g., etched, etc.) for deposition of a conductive pad 1004. As shown at FIG. 9, the opening 904 in the oxide layers 608 and 902 may have a different shape than that of the TSV 114. (The opening for an RDL layer is most likely to be a line, not a circle)

In an embodiment, the opening 904 for the conductive pad 1004 extends through the second layer 902 and partially (10-1000 nm) into the first layer 608. A barrier/adhesion layer 1002 (comprising titanium/titanium nitride, tantalum/tantalum nitride, etc.) may be deposited into the opening 904 (and may cover the entire surface of the opening 904), as shown at FIG. 10. A copper (or the like) deposition/plating (e.g., damascene process) fills the opening 904, which is planarized (via CMP, for example) to remove excess copper and to set a recess of the resulting conductive pad 1004 to a specified depth. The backside 602 surface may be prepared for bonding at this point. Alternately, a dual damascene process may be used to form an interconnect such as the conductive structure 1004, as desired.

Figure 11:
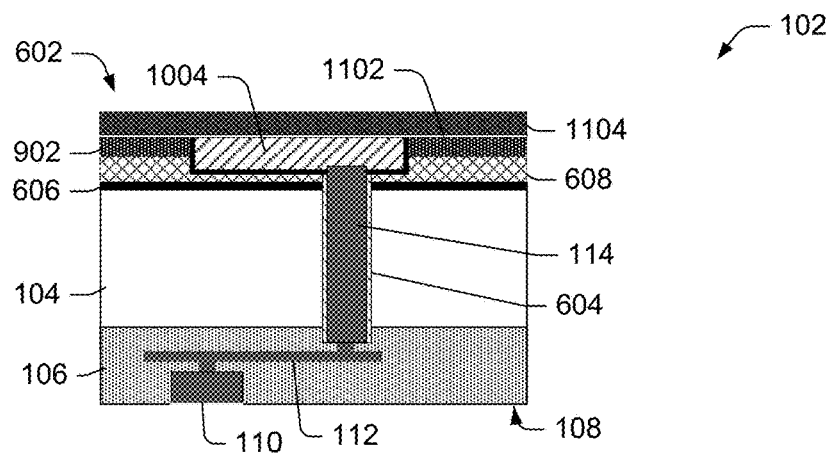

In another embodiment, as shown at FIG. 11, a thin (~10-500 nm) adhesion layer 1102, which may comprise silicon nitride, or the like, is deposited over the surface of the backside 602 (e.g., over the second layer 902 and the conductive pad 1004), followed by a third dielectric layer 1104 (e.g., oxide) as a bonding layer (e.g., DBI layer) for the backside 602. A thickness of the third dielectric layer 1104 (top layer) and a thickness of the conductive pad 1004 may be adjusted to minimize thin die warpage, and to achieve a desired anneal temperature. In various implementations, the first layer 608, the second layer 902, and the third layer 1104 are comprised of similar or the same materials (in varying thicknesses). In other implementations, one or more of the first layer 608, the second layer 902, and/or the third layer 1104 are comprised of different materials. In alternate implementations, additional dielectric layers may also be deposited over the first 608, second 610, and third 1104 layers to balance stress on the device side and minimize die warpage.

Figure 12:
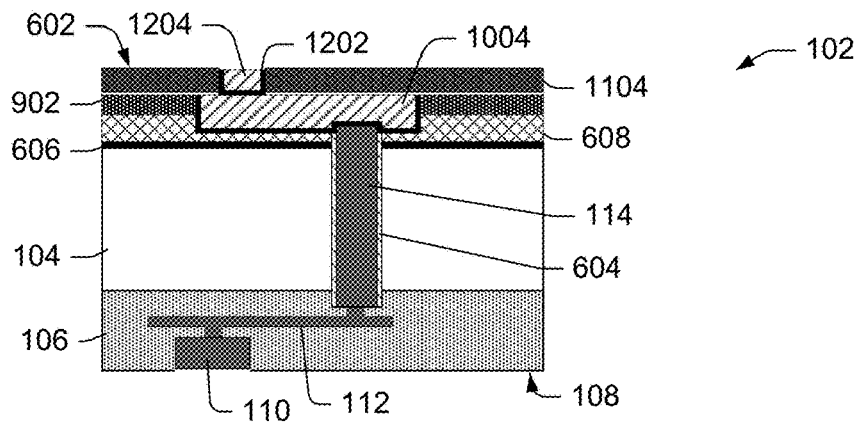
Figure 13:
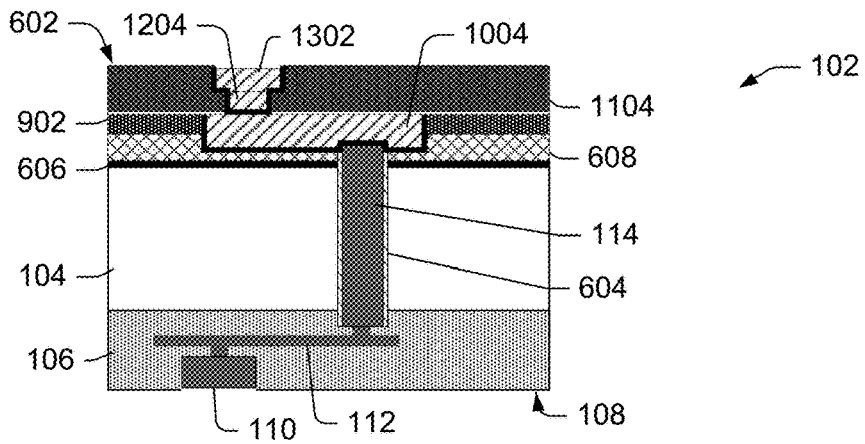

As shown at FIG. 12, the third layer 1104 may be patterned and etched for pad 1204 deposition. After etching an opening in the third layer 1104, a diffusion/adhesion layer 1202 (e.g., Ti/TiN) may be deposited to line the opening, after which the opening is filled (via damascene process, for example) with conductive material (e.g., copper) to form the pad 1204. The pad 1204 and the third layer 1104 are planarized (using CMP, for example) to prepare the backside 602 for direct bonding and to recess the pad 1204 to specification. In an alternate embodiment, as shown at FIG. 13, a dual damascene process may be used to add the pad 1204 as part of a via layer 1302.

Figure 14:
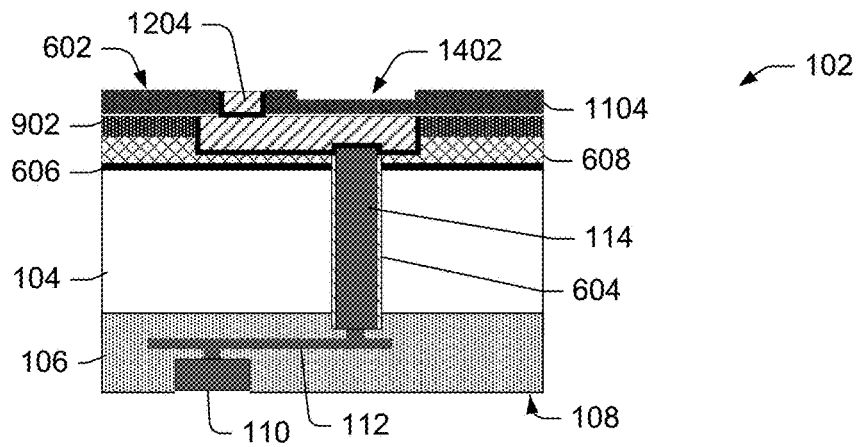
Figure 15:
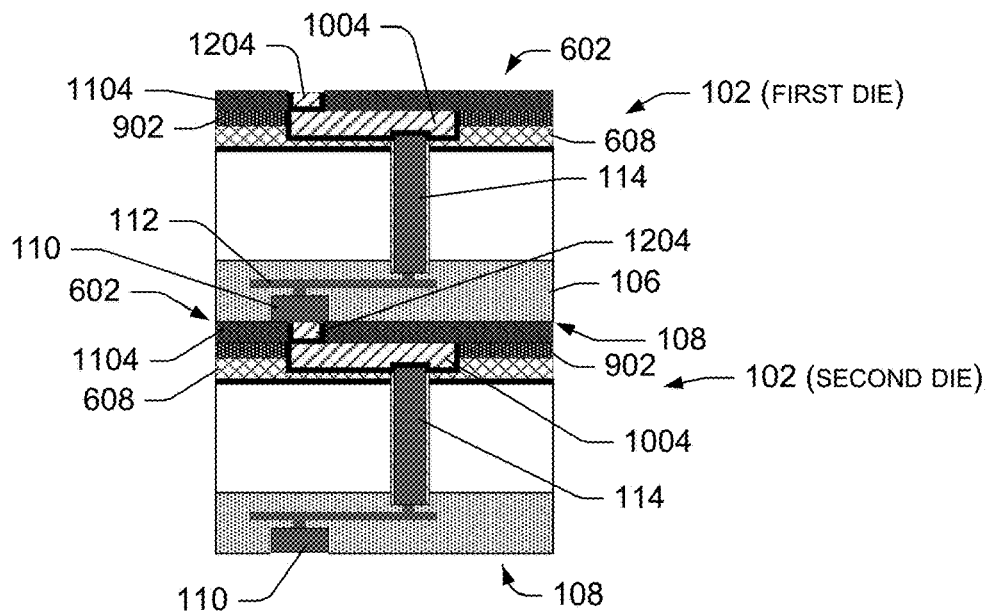
FIG. 15 shows a cross-section of two example bonded substrates with TSVs and offset bonding pads, bonded front to back, according to an embodiment.

In an implementation, as shown at FIG. 14, a recess 1402 can be etched on the backside 602 over the TSV 114, as a stress relief for metal expansion during annealing. The recess 1402 is disposed in the surface of the third layer 1104 (or other top-last layer of the backside 602) and through a portion of the third layer 1104 to provide stress relief for material expansion of the TSV 114 in the −z-direction. In the implementation, at least a portion of the recess 1402 is disposed over (e.g., overlapping) the TSV 114. The recess 1402 can be tuned, for example, to the volume of the TSV 114, using a prediction of material expansion of the TSV 114, based on the volume of the particular metal of the TSV 114. In some cases, the diameter or area of the recess 1402 is larger than the diameter or cross-sectional area of the TSV 114. The recess 1402 may be left open or may be filled with a material, such as a compliant material.

In other embodiments, alternate techniques may be used to reduce or eliminate delamination due to metal feature expansion, and remain within the scope of the disclosure.

FIGS. 15-19 show example stacking arrangements of the dies 102 formed with regard to FIGS. 6-14 (and like structures) with front side 108 and backside 602 interconnectivity. For example, at FIG. 15, an example "front-to-back" die 102 stack arrangement is shown. This bonds a front side bonding surface 108 of a first die 102 to a backside 602 bonding surface of a second die 102, including a contact pad 110 of the first die 102 to a contact pad 1204 of the second die 102. In an example, as discussed above, the conductive structure 1004 of the first and second dies 102 penetrate into the second dielectric layer 902 and the first dielectric layer 608 (without going through the first dielectric layer 608) of the first and second dies 102, below the respective bonding surfaces 602.

Figure 16:
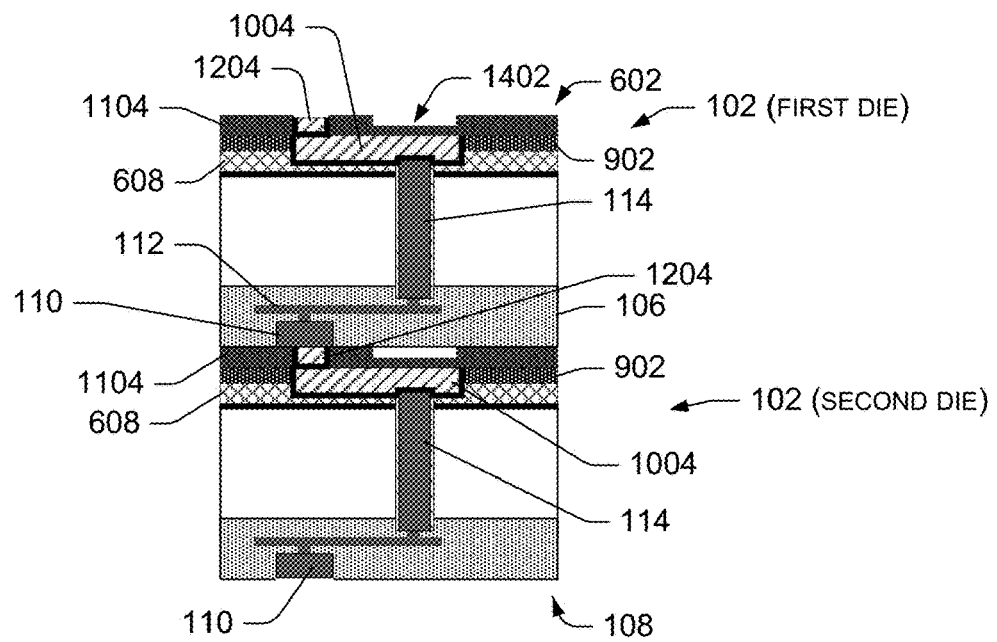
FIG. 16 shows a cross-section of two example bonded substrates with TSVs, offset bonding pads, and stress recesses, bonded front to back, according to an embodiment.

At FIG. 16, another example "front-to-back" die 102 stack arrangement is shown. In the embodiment illustrated at FIG. 16, each die 102 includes a recess 1402 at the backside 602 of the die 102, through the topmost layer (in this example, the third layer 1104). As discussed above, the recess 1402 provides stress relief from expanding material of the TSVs 114 during heated annealing. In an implementation, the recess 1402 may be filled with a compliant material. In an example, as discussed above, the conductive structure 1004 of the first and second dies 102 penetrate into the second dielectric layer 902 and the first dielectric layer 608 (without going through the first dielectric layer 608) of the first and second dies 102, below the respective bonding surfaces 602.

Figure 17:
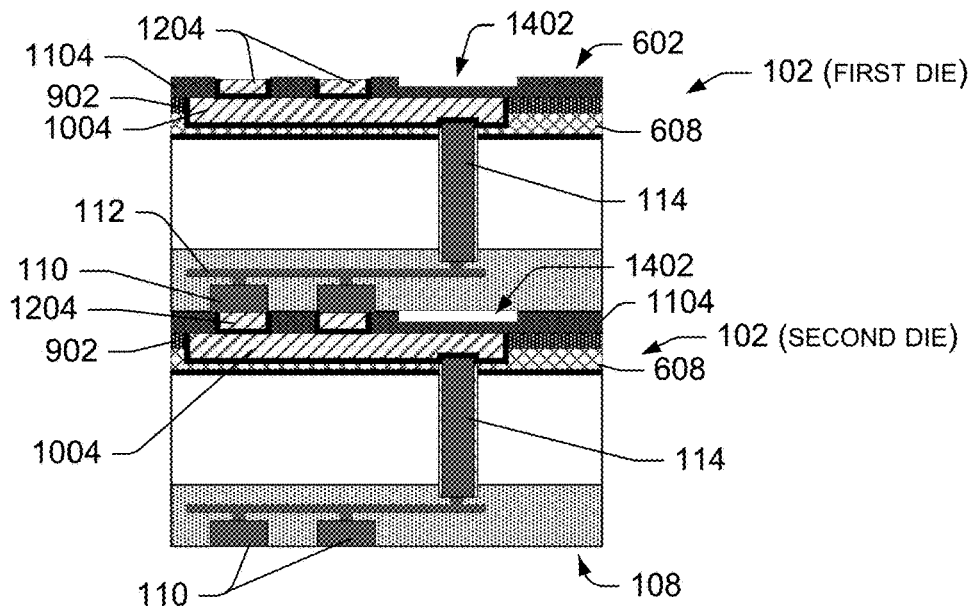
FIG. 17 shows a cross-section of two example bonded substrates with TSVs, multiple offset bonding pads, and stress recesses, bonded front to back, according to an embodiment.

At FIG. 17, a further example "front-to-back" die 102 stack arrangement is shown. In the embodiment illustrated at FIG. 17, each die 102 includes multiple contact pads 110 (which may be coupled to the respective TSV 114 by one or more traces 112, or the like) and multiple contact pads 1204 (which may be coupled to the respective TSV 114 by a conductive structure 1004, or the like). The first and second dies 102 are stacked so that the multiple contact pads 110 of the first die 102 are bonded to the multiple contact pads 1204 of the second die 102.

In various implementations, the dies 102 may include a recess 1402 disposed on the backside 602 above the respective TSV 114 (as shown in FIG. 17) to provide stress relief from expanding material of the TSVs 114 during heated annealing. In an implementation, the recesses 1402 may be filled with a compliant material. In an example, as discussed above, the conductive structure 1004 of the first and second dies 102 penetrate into the second dielectric layer 902 and the first dielectric layer 608 (without going through the first dielectric layer 608) of the first and second dies 102, below the respective bonding surfaces 602.

Figure 18:
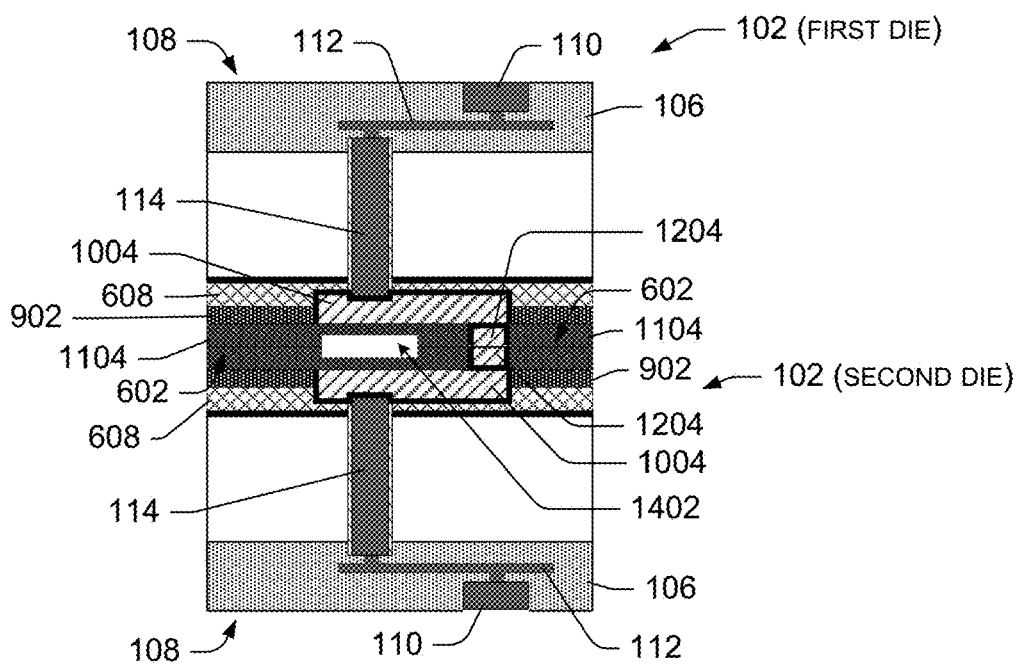
FIG. 18 shows a cross-section of two example bonded substrates with TSVs, offset bonding pads, and stress recesses, bonded back to back, according to an embodiment.

At FIG. 18, an example "back-to-back" die 102 stack arrangement is shown. This bonds a backside 602 bonding surface of a first die 102 to a backside 602 bonding surface of a second die 102, including a contact pad 1204 of the first die 102 to a contact pad 1204 of the second die 102. In an example, as discussed above, the conductive structure 1004 of the first and second dies 102 penetrate into the second dielectric layer 902 and the first dielectric layer 608 (without going through the first dielectric layer 608) of the first and second dies 102, below the respective bonding surfaces 602.

Figure 19:
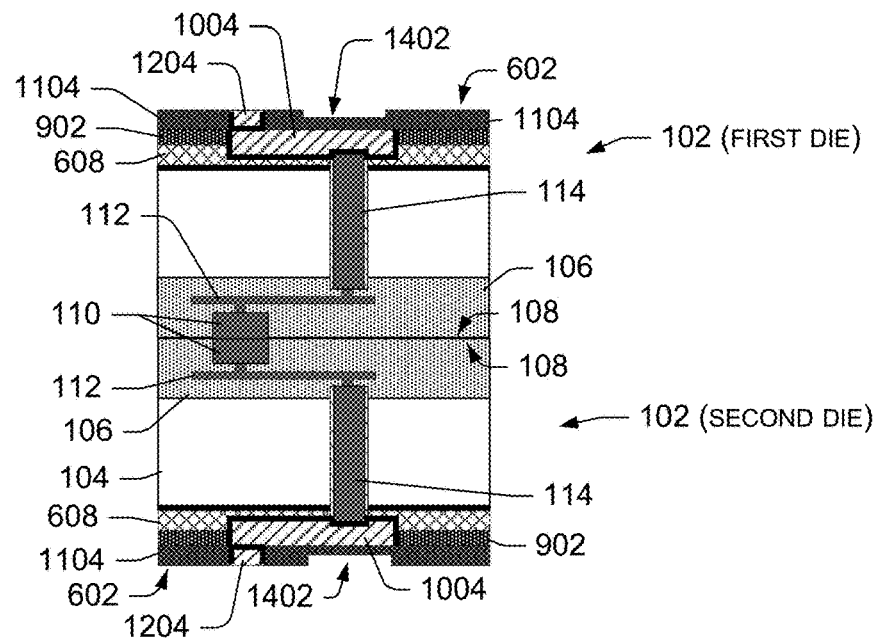
FIG. 19 shows a cross-section of two example bonded substrates with TSVs, offset bonding pads, and stress recesses, bonded front to front, according to an embodiment.

At FIG. 19, an example "front-to-front" die 102 stack arrangement is shown. This bonds a front side bonding surface 108 of a first die 102 to a front side bonding surface 108 of a second die 102, including one or more contact pads 110 of the first die 102 to one or more contact pads 110 of the second die 102. In the example shown, the contact pads 110 are electrically coupled to the TSVs 114 of the respective dies 102 by one or more traces 112, or the like. In an example, as discussed above, the conductive structure 1004 of the first and second dies 102 penetrate into the second dielectric layer 902 and the first dielectric layer 608 (without going through the first dielectric layer 608) of the first and second dies 102, below the respective bonding surfaces 602.

Figure 20:
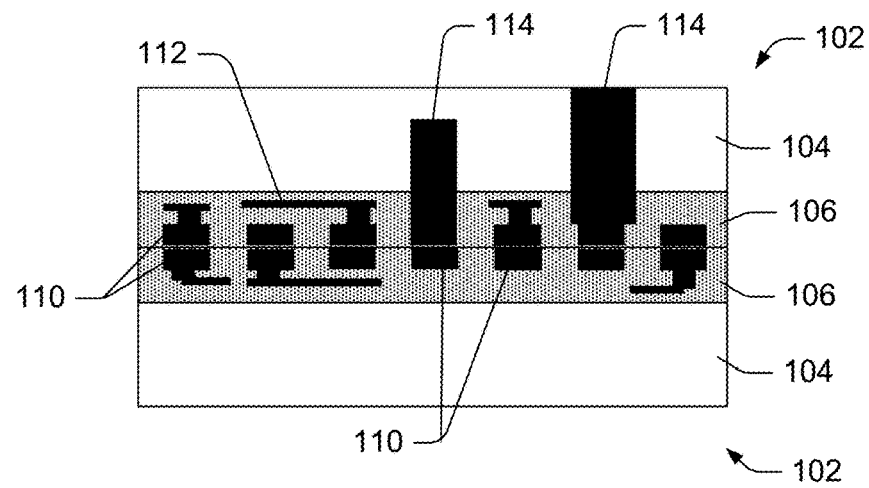
FIG. 20 shows a diagram of example TSVs used for heat management of a die, according to various embodiments.

In various embodiments, as illustrated at FIG. 20, one or more of the TSVs 114 of a set of stacked dies 102 may be used to conduct heat in addition to or instead of electrical signals. For example, in some cases, it may not be practical or possible to attach a heat sink (or other heat transfer device) to a die 102 of a set of stacked dies 102 to alleviate heat generated by the die 102. In such cases, other techniques may be looked-for to transfer heat as desired.

In the embodiments, as shown at FIG. 20, various configurations of TSVs 114, including TSVs that extend partially or fully through a die 102, may be employed to conduct heat away from the dies 102 (or away from a heat-generating portion of the dies 102). The TSVs 114 of one die 102 may be used in conjunction with TSVs 114, contact pads 110, traces 112, and the like, of the second die 102 to complete heat transfer from one die 102 to the other die 102, and so forth. The TSVs 114 of the first die 102 can be direct bonded (e.g., DBI) to the TSVs 114, contact pads 110, traces 112, and the like of the second die 102 for high performance thermal conductivity.

In an implementation, some of the TSVs 114, contact pads 110, traces 112, and the like are electrically floating or "dummy" structures, which can be used for thermal transfer. These structures may conduct heat away from a high power die 102 to another die 102 or substrate as desired. Dummy contact pads 110 may be coupled to via last or via mid thermal TSVs 114 for thermal conduction.

In the embodiments, diffusion barrier layers 604, which surround the TSVs 114 and can be thermally restrictive or thermal barriers may be replaced by diffusion barriers of a different material having some thermal conductivity (such as metal or alloy barriers, or the like).

Example Process

FIG. 21 illustrates a representative process 2100 for preparing various microelectronic components (such as dies 102, for example) for bonding, such as for direct bonding without adhesive) while reducing or eliminating the potential for delamination due to metal expansion of embedded structures at the bonding surface. For instance, through-silicon vias (TSVs) at the bonding surface may cause delamination, particularly when coupled to contact pads, as the material of the TSVs and the contact pads expands during heated annealing. The process refers to FIGS. 1-20.

The order in which the process is described is not intended to be construed as limiting, and any number of the described process blocks in the process can be combined in any order to implement the process, or alternate processes. Additionally, individual blocks may be deleted from the process without departing from the spirit and scope of the subject matter described herein. Furthermore, the process can be implemented in any suitable hardware, software, firmware, or a combination thereof, without departing from the scope of the subject matter described herein. In alternate implementations, other techniques may be included in the process in various combinations and remain within the scope of the disclosure.

In an implementation, a die, wafer, or other substrate (a "substrate") is formed using various techniques to include a base substrate and one or more dielectric layers. In the implementation, at block 2102, the process 2100 includes embedding a first through silicon via (TSV) (such as TSV 114, for example) into a first substrate having a first bonding surface (such as bonding surface 108, for example), the first TSV extending partially through the first substrate, normal to the first bonding surface and not exposed at the first bonding surface.

In the implementation, at block 2104, the process includes disposing a first metal contact pad (such as contact pad 110, for example) at the first bonding surface, offset relative to the first TSV, not overlapping the first TSV, and extending partially into the first substrate below the first bonding surface. In an implementation, the process includes predicting an amount that a material of the first metal contact pad will expand when heated to a preselected temperature, based on a volume of the material of the first metal contact pad and a CTE of the material of the first metal contact pad; and selecting the first metal contact pad based on the predicting. In an example, the selecting comprises selecting a diameter or a surface area of the first metal contact pad.

In another example, the process includes determining a desired recess for the first metal contact pad relative to the first bonding surface, to allow for expansion of the material of the first metal contact pad; and selecting the first metal contact pad to have a perimeter shape likely to result in the desired recess when the first metal contact pad is planarized. In an embodiment, the process includes forecasting an amount of recess that is likely to occur in a surface of the first metal contact pad as a result of the planarizing, based on a diameter or an area of the first metal contact pad, and selecting the first metal contact pad based on the forecasting.

In an implementation, the process includes determining a desired recess for the first metal contact pad relative to the first bonding surface, to allow for expansion of the material of the first metal contact pad; and forming the desired recess in a surface of the first metal contact pad. In one example, the process includes forming the surface of the first metal contact pad to have a domed or uneven topology.

At block 2106, the process includes electrically coupling the first metal contact pad to the first TSV with one or more embedded conductive traces (such as conductive traces 112, for example).

In an implementation, the process includes planarizing the first bonding surface to have a predetermined maximum surface variance for direct bonding and the first metal contact pad to have a predetermined recess relative to the first bonding surface.

In an implementation, the process includes forming a recess (such as the recess 502, for example) in the first bonding surface above the first TSV. In one example, the process includes estimating an amount that a material of the first TSV will expand when heated to a preselected temperature, based on a volume of the material of the first TSV and a coefficient of thermal expansion (CTE) of the material of the first TSV; and determining a depth and an area of the recess in the first bonding surface, based on the volume of the material of the first TSV and a coefficient of thermal expansion (CTE) of the material of the first TSV. For instance, the process can include forming the recess in the first bonding surface to have a diameter that is larger by a predetermined amount than a diameter of the first TSV.

In an implementation, the process includes depositing one or more insulating stress-relief layers on a second surface of the first substrate opposite the insulating layer and planarizing the one or more stress-relief layers to form a second bonding surface having a second predetermined maximum surface variance. In an example, the process includes depositing a first low temperature insulating layer at the second surface of the first substrate, a second low temperature insulating layer over the first low temperature insulating layer, and a third insulating layer over the second low temperature insulating layer to form the second bonding surface.

In an implementation, the process includes patterning the second low temperature insulating layer, etching an opening over the first TSV, the opening extending through the second low temperature insulating layer and partially through the first low temperature insulating layer, depositing a conductive material within the opening to form a conductive pad electrically coupled to the first TSV, and depositing the third insulating layer over the second low temperature insulating layer and the conductive pad. In an example, the process includes depositing a barrier layer onto exposed surfaces of the opening prior to depositing the conductive material within the opening.

In another implementation, the process includes patterning the third insulating layer, etching a second opening over the conductive pad, the second opening extending through the third insulating layer and exposing the conductive pad, and depositing a conductive material within the second opening to form a second contact pad electrically coupled to the conductive pad.

In an implementation, the process includes direct bonding the first substrate to a second substrate using a direct dielectric-to-dielectric, non-adhesive bonding technique at the second bonding surface of the first substrate or at the first bonding surface of the first substrate.

In an alternate implementation, the process includes transferring heat from the first substrate to the second substrate via the first TSV and one or more conductive structures embedded within the second substrate and exposed at a bonding surface of the second substrate.

In various embodiments, some process steps may be modified or eliminated, in comparison to the process steps described herein.

The techniques, components, and devices described herein are not limited to the illustrations of FIGS. 1-21, and may be applied to other designs, types, arrangements, and constructions including with other electrical components without departing from the scope of the disclosure. In some cases, additional or alternative components, techniques, sequences, or processes may be used to implement the techniques described herein. Further, the components and/or techniques may be arranged and/or combined in various combinations, while resulting in similar or approximately identical results.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A method of forming a microelectronic assembly, comprising:
providing a first through silicon via (TSV) into a first substrate having a first bonding surface, the first TSV extending in a direction normal to the first bonding surface through at least a portion of the first substrate without being exposed at the first bonding surface;
providing a recess in the first bonding surface, aligned with and overlapping the first TSV in a direction normal to the first bonding surface;
providing a first metal contact pad at the first bonding surface, offset relative to the first TSV and not overlapping the first TSV in the direction normal to the first bonding surface, the first metal contact pad electrically coupled to the first TSV with one or more embedded conductive traces; and
bonding the first substrate to a second substrate, the recess adjacent to disposed at a bonding interface between the first and second substrates.

2. The method of forming a microelectronic assembly of claim 1, wherein the one or more embedded conductive traces are provided as part of a redistribution layer and at least a portion of the redistribution layer is disposed between the first TSV and the recess.

3. The method of forming a microelectronic assembly of claim 1, further comprising providing the recess in the first bonding surface to have a diameter that is larger by a predetermined amount than a diameter of the first TSV.

4. The method of forming a microelectronic assembly of claim 1, wherein the recess comprises an expansion region, for expansion of the first TSV during a bonding process.

5. The method of forming a microelectronic assembly of claim 1, further comprising removing material from the first substrate to expose the first TSV at a side opposite the first bonding surface.

6. The method of forming a microelectronic assembly of claim 1, further comprising shaping an exposed surface of the first metal contact pad.

7. A method of forming a microelectronic assembly, comprising:
forming a first substrate to have a base layer and an insulating layer over the base layer, the insulating layer having a first bonding surface, a first through silicon via (TSV) extending at least partially through the base layer of the first substrate in a direction normal to the first bonding surface without being exposed at the first bonding surface;
forming a recess in the first bonding surface overlapping the first TSV, the recess comprising an expansion region configured to compensate for thermal expansion of the first TSV during a bonding step;
disposing a first metal contact pad at the first bonding surface, the first metal contact pad offset relative to a location of the first TSV;
electrically coupling the first metal contact pad to the first TSV with one or more embedded conductive traces; and
direct bonding the first substrate to a second substrate using a direct dielectric-to-dielectric, non-adhesive bonding technique at the first bonding surface of the first substrate.

8. The method of forming a microelectronic assembly of claim 7, further comprising planarizing the first bonding surface to have a predetermined maximum surface variance for direct bonding and the first metal contact pad to have a predetermined recess relative to the first bonding surface.

9. The method of forming a microelectronic assembly of claim 7, further comprising depositing one or more inorganic dielectric layers on a second surface of the first substrate opposite the insulating layer and planarizing the one or more inorganic dielectric layers to form a second bonding surface having a second predetermined maximum surface variance.

10. The method of forming a microelectronic assembly of claim 9, further comprising direct bonding the first substrate to a second substrate using a direct dielectric-to-dielectric, non-adhesive bonding technique at the second bonding surface of the first substrate.

11. The method of forming a microelectronic assembly of claim 9, wherein the depositing comprises depositing a first low temperature insulating layer at the second surface of the first substrate, a second low temperature insulating layer over the first low temperature insulating layer, and a third insulating layer over the second low temperature insulating layer to form the second bonding surface.

12. The method of forming a microelectronic assembly of claim 11, further comprising:
patterning the second low temperature insulating layer;
etching an opening over the first TSV, the opening extending through the second low temperature insulating layer and partially through the first low temperature insulating layer;
depositing a conductive material within the opening to form a conductive pad electrically coupled to the first TSV; and
forming a recess in or above the conductive material relative to the second bonding layer.

13. The method of forming a microelectronic assembly of claim 12, further comprising depositing an adhesion/barrier layer onto exposed surfaces of the opening prior to depositing the conductive material within the opening.

* * * * *

UNITED STATES PATENT AND TRADEMARK OFFICE
CERTIFICATE OF CORRECTION

PATENT NO. : 10,998,292 B2
APPLICATION NO. : 16/440633
DATED : May 4, 2021
INVENTOR(S) : Bongsub Lee et al.

It is certified that error appears in the above-identified patent and that said Letters Patent is hereby corrected as shown below:

In the Claims

In Claim 1, Column 15, Line 34, please delete "adjacent to"

Signed and Sealed this
Thirteenth Day of June, 2023

Katherine Kelly Vidal
*Director of the United States Patent and Trademark Office*